United States Patent
Lin

(10) Patent No.: US 6,389,500 B1
(45) Date of Patent: May 14, 2002

(54) FLASH MEMORY

(75) Inventor: Reitseng Lin, Marlboro, NJ (US)

(73) Assignee: Agere Systems Guardian Corporation, Allentown, PA (US)

( * ) Notice: Subject to any disclaimer, the term of this patent is extended or adjusted under 35 U.S.C. 154(b) by 0 days.

(21) Appl. No.: 09/322,736

(22) Filed: May 28, 1999

(51) Int. Cl.$^7$ .......................... G06F 13/00; G11C 16/02
(52) U.S. Cl. .................. 710/302; 711/103; 365/185.33
(58) Field of Search ............................... 710/100–302; 711/103; 365/185.33

(56) References Cited

U.S. PATENT DOCUMENTS

| | | | |
|---|---|---|---|
| 5,034,922 A | * | 7/1991 | Burgess |
| 5,339,279 A | * | 8/1994 | Toms et al. |
| 5,341,330 A | * | 8/1994 | Wells et al. |
| 5,355,464 A | * | 10/1994 | Fandrich et al. |
| 5,369,616 A | * | 11/1994 | Wells et al. |
| 5,369,647 A | * | 11/1994 | Kreifels et al. |
| 5,377,145 A | * | 12/1994 | Kynett et al. |
| 5,564,032 A | * | 10/1996 | Aota et al. |
| 5,566,323 A | * | 10/1996 | Ygon |
| 5,568,423 A | * | 10/1996 | Jou et al. |
| 5,572,707 A | * | 11/1996 | Rozman et al. |
| 5,581,723 A | * | 12/1996 | Hasbun et al. |
| 5,596,738 A | * | 1/1997 | Pope |
| 5,648,929 A | * | 7/1997 | Miyamoto |
| 5,650,963 A | * | 7/1997 | Roohoarvar et al. |
| 5,657,467 A | * | 8/1997 | Hasegawa |
| 5,748,535 A | * | 5/1998 | Lin et al. |
| 5,748,940 A | * | 5/1998 | Angelo et al. |
| 5,748,972 A | * | 5/1998 | Clark et al. |
| 5,778,440 A | * | 7/1998 | Yiu et al. |
| 5,805,501 A | * | 9/1998 | Shiau et al. |
| 5,822,244 A | * | 10/1998 | Hansen et al. |
| 5,835,706 A | * | 11/1998 | Hikichi et al. |

* cited by examiner

Primary Examiner—Sumati Lefkowitz
(74) Attorney, Agent, or Firm—Darby & Darby

(57) ABSTRACT

An embedded system for preventing removal of a control circuit pack during programming of a flash memory. The embedded system includes a reset button to be pressed prior to unplugging the control circuit pack and an indicator for signaling when the control circuit pack may be safely removed or unplugged from a shelf. In the case in which the flash memory is uninterruptable, all of the interrupts, except for a power reset interrupt, are inhibited during programming of at least one block of the flash memory. Upon activating the reset button, if programming of the flash memory is completed, then the reset interrupt is invoked and an indicator is enabled thereby signaling that it is safe to remove the control circuit pack. Otherwise, if programming of the flash memory is in progress, then the reset interrupt, like all other interrupts, is inhibited. Alternatively, the flash memory may be interruptable. In this case the system also includes a timer interrupt invoked after a timer has completed a countdown of a predefined time interval. During programming predetermined interrupts that require processor time to the extent that exceeds the programming time required, excluding the reset interrupt and the timer interrupt, are inhibited. The reset interrupt is invoked upon pressing the reset button. In response to invoking the reset interrupt, if programming of the flash memory is in progress then the timer is set to countdown for the predefined interval and programming is resumed from the position of interruption. Completion of the timer countdown for the predefined time interval invokes a timer interrupt handler that continuously resets the timer to countdown for the predefined time interval, and upon completion of the countdown determines whether programming of the flash memory is in progress. The indicator is enabled when programming of the flash memory is no longer in progress at the completion of the countdown of a predefined timed interval.

11 Claims, 4 Drawing Sheets

ENABLE INDICATOR UNTIL THE CONTROL CIRCUIT PACK IS UNPLUGGED — 225

FLASH MEMORY

FIELD OF THE INVENTION

The present invention relates to a flash memory.

DESCRIPTION OF RELATED ART

Non-volatile memory devices, such as electronically erasable programmable read only memories (EEPROMs) and erasable programmable read only memories (EPROM), are widely used in data processing systems to retain data information even when the power is removed. One specific type of EEPROM is a flash EEPROM, wherein data stored therein is erased in blocks, instead of on a byte level. For example, if a byte in a block must be changed, the entire block must be erased and reprogrammed.

Flash memories are commonly used in a wide range of embedded applications, that is, systems in which a controller is employed as the primary control chip in an electronic circuit embedded in a product other than a general purpose computer system. The flash memory is generally used to store control codes and operational parameters, such as error reporting thresholds and system states. When the information in the flash memory changes, the controller updates the data by erasing and reprogramming the blocks affected in the flash memory. In such systems, the flash memory device and controller may be physically located on different circuit packs. Since the two devices are located on separate circuit packs they may be unplugged or removed independently from one another. If the controller is unplugged or removed before completion of the reprogramming operation of the flash memory, then the data therein will be corrupted.

One known solution to this problem is to provide a reset button on the board. By enabling the reset button, a timer is set for a predefined period of time. Upon expiration of the predefined period of time, the software timer interrupt handler starts the reset sequence and the control circuit pack may be unplugged. This solution assumes that the reprogramming of the flash memory will be completed during the predefined period of time. Although the timer usually ensures that the flash memory has finished programming one block within the predefined period, reprogramming of a second block of the flash memory may already be in progress when the predefined period of time expires and the reset sequence is started. In this situation, if the control circuit pack is unplugged the data in the second block of memory will be corrupted.

SUMMARY OF TH INVENTION

The present invention is an embedded system that overcomes these problems and prevents removal of the control circuit pack during programming of the flash memory.

In particular, the present invention is directed to an embedded system for preventing removal of a control circuit pack during programming of a flash memory. The embedded system includes a reset button for invoking a reset interrupt and an indicator for signaling when the control circuit pack may be safely removed or unplugged from a shelf. In the case in which programming of the flash memory is uninterruptable, all of the interrupts, except for a power reset interrupt, are inhibited during programming of at least one block of the flash memory. Before unplugging the flash memory from the shelf, a reset button is pressed. If programming of the flash memory is in progress, then upon activating the reset button the reset interrupt, like all other interrupts, is inhibited. Otherwise, if the reset interrupt is invoked, an indicator signaling the completion of programming of the flash memory is enabled.

Alternatively, if programming of the flash memory is interruptable, then none of the interrupts are inhibited during programming of the flash memory. In this case the system also includes a timer interrupt automatically invoked after a timer has completed a countdown of a predefined time interval. During programming predetermined interrupts, except for the reset interrupt or the timer interrupt, that require processor time that exceeds the programming time required, are inhibited. In response to invoking a reset interrupt, if programming of the flash memory is in progress, then the time is set to countdown for the predefined time interval and return from the interrupt to resume programming from the position of interruption. Completion of the countdown invokes a timer interrupt handler that continuously resets the timer to countdown for the predefined time interval and upon completion of the countdown, determines whether programming of the flash memory is in progress. The indicator is enabled when programming of the flash memory is no longer in progress.

BRIEF DESCRIPTION OF THE DRAWINGS

In the drawing:

FIG. 2b is an exemplary flow chart of the operation of the reset interrupt handling module used in connection with the flash programming module of FIG. 2a;

FIG. 3 is another exemplary structure of a system in accordance with the present invention for preventing data corruption in an interruptable flash memory when the control circuit is unplugged from the circuit board;

FIG. 4b is an exemplary flow chart of the operation of the reset interrupt handling module used in connection with the flash programming module of FIG. 4a; and FIG. 4c is an exemplary flow chart of the operation of the timer interrupt handling module used in connection with the flash programming module of FIG. 4a.

DETAILED DESCRIPTION OF THE INVENTION

There are two classifications of flash memory devices, "uninterruptable" and "interruptable", depending on whether the programming of the memory device may be interrupted. In the case of an uninterruptable flash, such as Atmel AT29C2256, programming of the flash memory can not be interrupted. Therefore, all interrupts are inhibited, except for a power reset interrupt which can not be inhibited. On the other hand, the programming activity in an interruptable flash memory device may be interrupted by predetermined interrupts.

Figure 1:
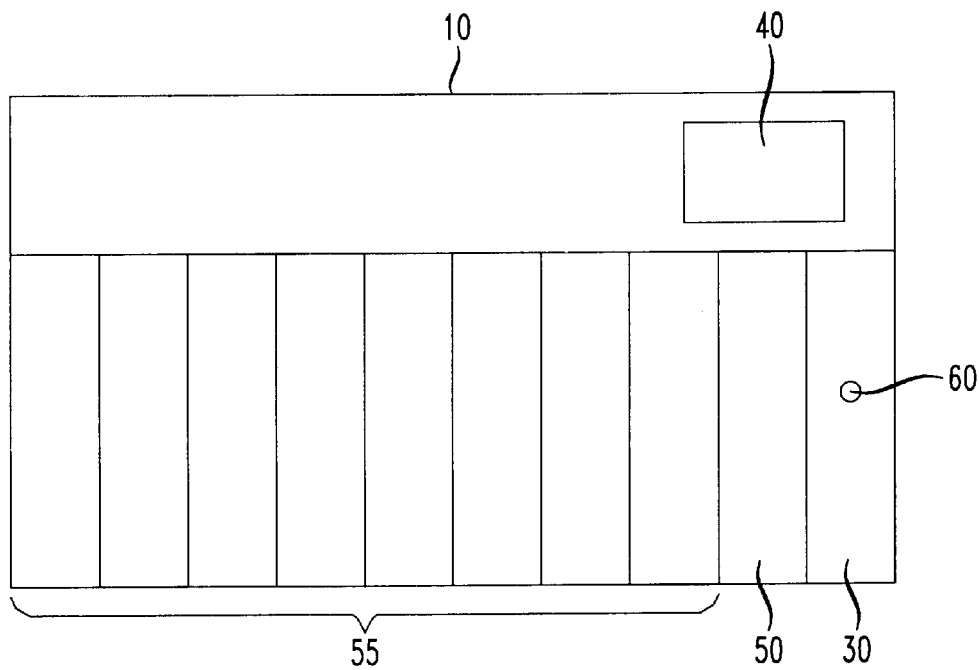
FIG. 1 is an exemplary structure of a system in accordance with the present invention for preventing data corruption in an uninterruptable flash memory when the control circuit pack is removed from a shelf.

FIG. 1 is an exemplary system in accordance with the present invention for preventing data corruption in an uninterruptable flash memory device when a control circuit pack is unplugged or removed from a shelf. An indicator 40 is provided to signal when programming of the flash memory is completed. A flash memory circuit pack 50 and a control circuit pack 30 are plugged into a shelf 10 having a backplane which provides electrical connectivity between the circuit packs plugged therein. Although only two circuit packs are described, any number of additional circuit packs 55 may be plugged into the shelf. The indicator device 40 may be a light emitting diode (LED), which may be located in the face plate in any desired location, such as above the circuit packs (as shown in FIG. 1), on the control circuit pack, on the flash memory circuit pack, or on any other circuit pack. The indicator device is enabled, e.g., the indicator button is illuminated, when a reset interrupt is invoked and programming of the flash memory is completed, and disabled, e.g., the indicator button is turned off, when the control circuit pack has been unplugged. Indicator device 40 may be audio, visual, or both. A status flag from the software executed by the control circuit pack is used to enable/disable the indicator device, as described in detail below.

Figure 2A:
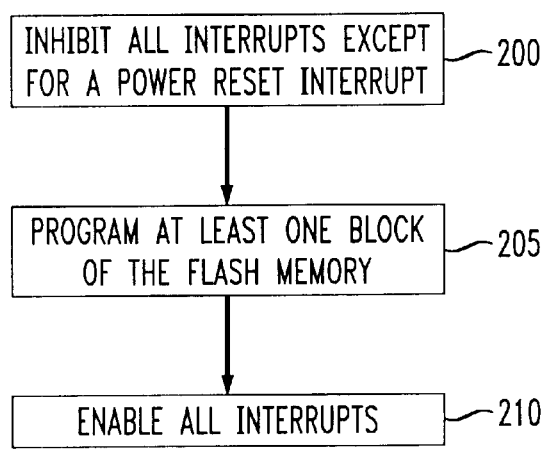
FIG. 2a is an exemplary flow chart of the operation of the flash programming module in the system in FIG. 1.

FIG. 2a is an exemplary flow chart of the operation of the flash programming module in a system for an uninterruptable flash. Before programming of a block in the flash memory, in step 200, all interrupts (except for a power reset interrupt which can not be inhibited) are inhibited so that programming of the flash memory can be completed without interruption. Thereafter, in step 205 at least one block of the flash memory is programmed. After programming of the flash memory is completed, all interrupts are enabled in step 210.

Figures 2B, 3:
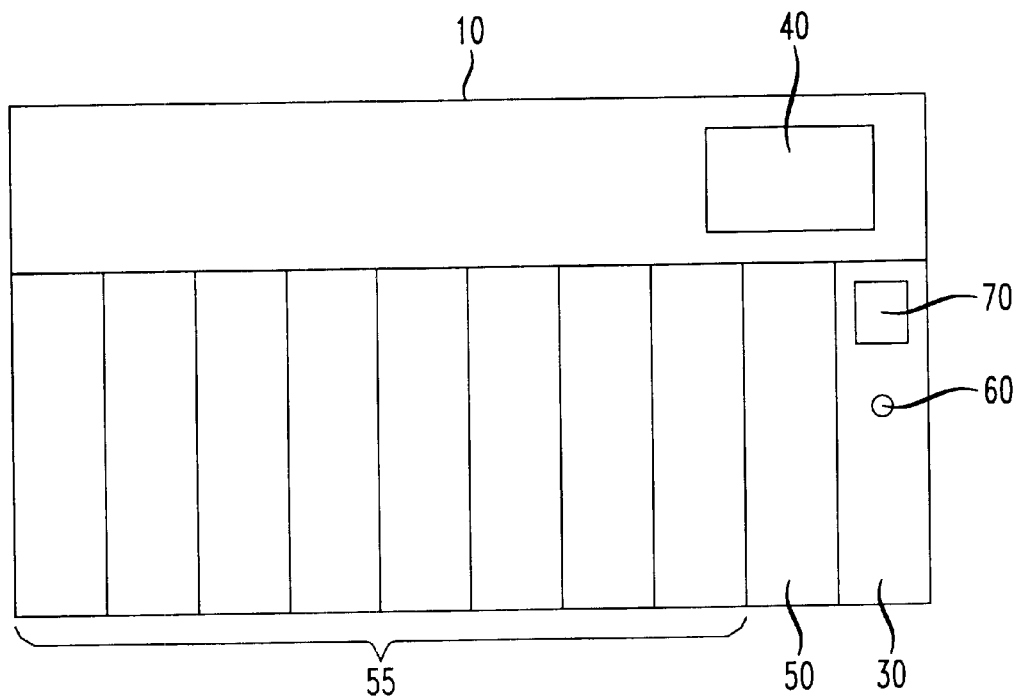

FIG. 2b is an exemplary flow chart of the operation of the reset interrupt handling module used in connection with the flash reprogramming module of FIG. 2a. In operation, before unplugging the control pack a reset button 60 (FIG. 1) is set. If reset button 60 is pushed while the programming activity is in progress, then the reset interrupt, like all other interrupts except for the power reset interrupt, is inhibited. Otherwise, if the interrupts are not inhibited, then the reset interrupt handler is invoked and in step 225 the indicator is enabled thereby signaling that the control circuit pack can be safely unplugged. The reset interrupt handler remains enabled until the control pack is unplugged. Alternatively, if some indication is provided that the system is booting up, then in step 225 the reset interrupt handler can simply activate the power reset sequence. Thus, a check is made prior to unplugging the control circuit pack to ensure that programming of the flash memory is not in progress. The indicator will only be illuminated when the result of the check is that programming of the flash memory is not in progress. Unplugging of the circuit pack will therefore only be performed while the indicator is illuminated.

The second type of memory is an "interruptable" flash memory, such as Intel 28F008SA, in which programming of the flash memory can be interrupted. FIG. 3 is an exemplary structure of the system used to monitor the status of the programming of the block of flash memory in an interruptable flash memory. The system is similar to that shown in FIG. 1, except that a hardware or operating system timer 70 must be provided in the control circuit pack. Software in the control circuit pack 30 is used to set the timer for a predefined time interval, preferably 200 ms. The predefined time interval is dependent on the particular flash memory chip. It should also be noted that the predefined interval need not be fixed and may vary depending on the type of flash memory device.

Figure 4A:
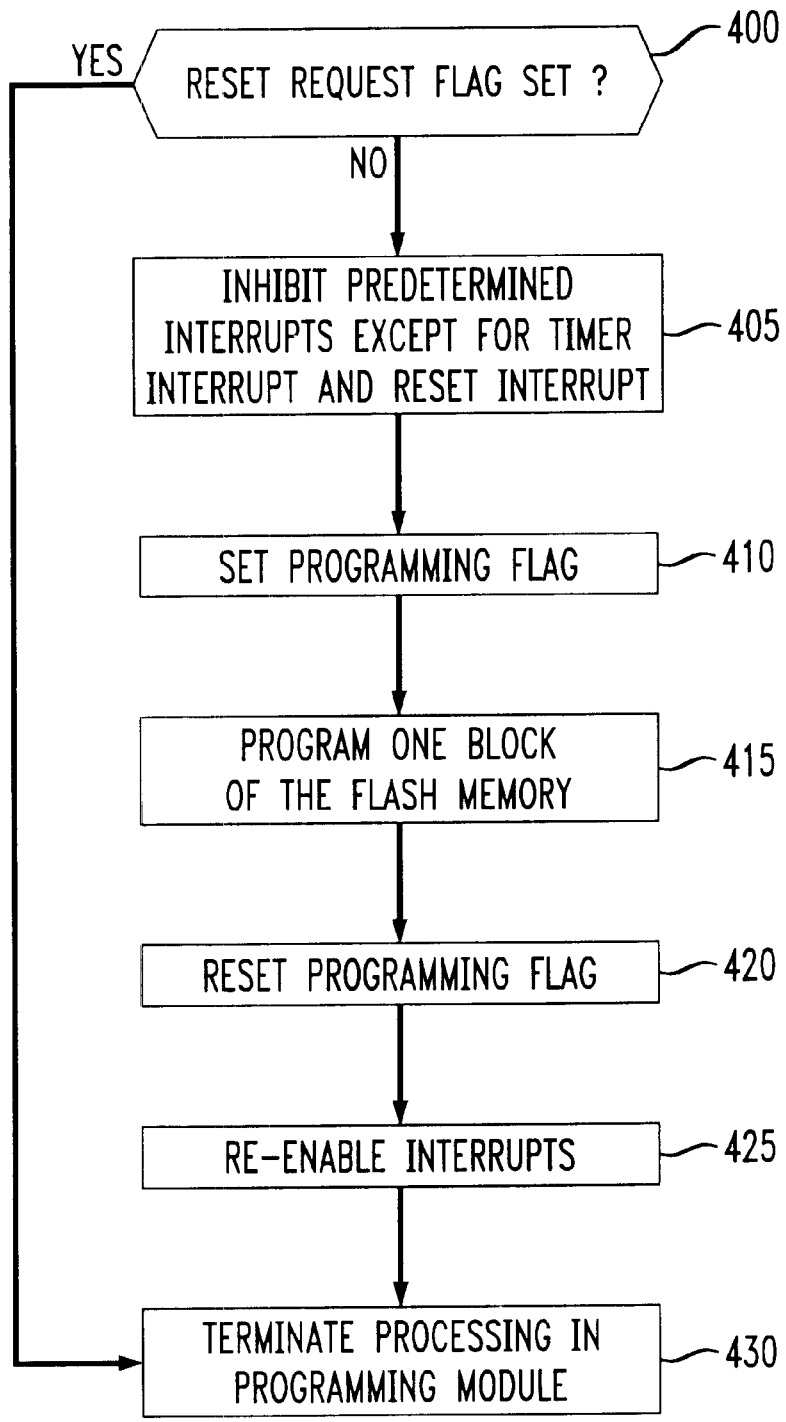
FIG. 4a is an exemplary flow chart of the operation of the flash programming module in the system in FIG. 3.

In the case of an interruptable flash, instead of inhibiting all interrupts as with the uninterruptable flash, interrupts that require processor time in excess of the programming time required are inhibited. FIG. 4a is an exemplary flow chart of the operation of the flash programming module in a system for an interruptable flash. Initially, in step 400, a determination is made whether a RESET REQUEST flag is set, which occurs when the reset interrupt handler has been invoked as a result of pressing a reset button prior to unplugging the control circuit pack when programming of the flash memory is in progress. If the RESET REQUEST flag is set then the system exits from the programming module in step 430. Otherwise, in step 405 predetermined interrupts, excluding the timer interrupt and the reset interrupt, are inhibited. The PROGRAMMING flag is set in step 410 and one block of the flash memory is programmed in step 415. After completing the programming operation, the PROGRAMMING flag is reset in step 420 and the interrupts that were inhibited are re-enabled in step 425.

Figure 4B:
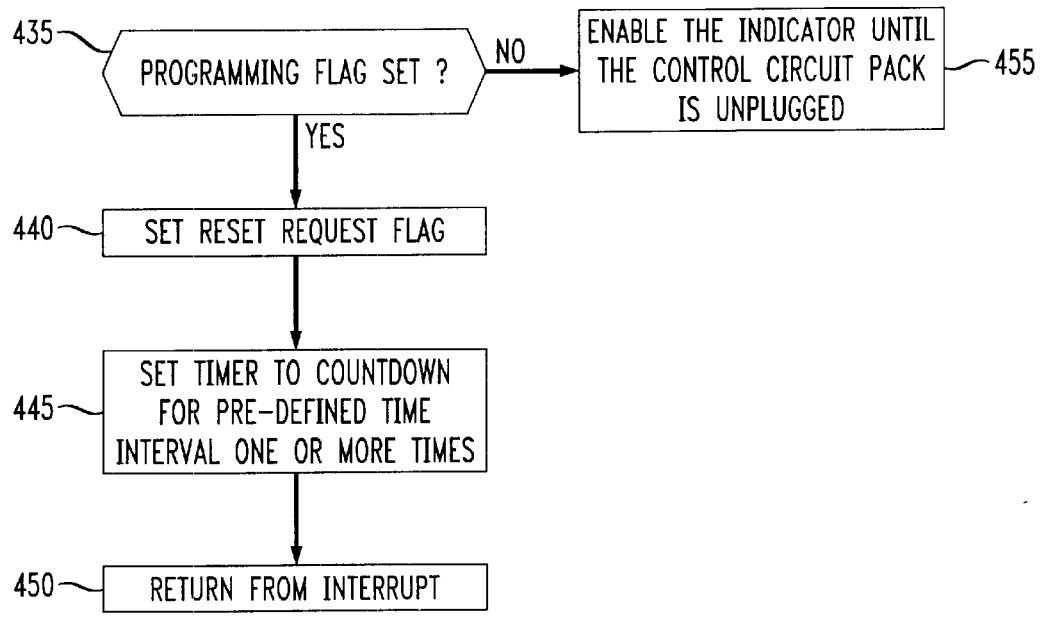

FIG. 4b is an exemplary flow chart of the operation of the reset interrupt handler module used in connection with the flash programming module of FIG. 4a. In operation, before unplugging the control pack a reset button 60 (FIG. 3) is set causing a reset interrupt handler in FIG. 4b to be invoked and, if in progress, programming of the flash memory is temporarily ceased. A determination is made in step 435 whether the PROGRAMMING flag is set. The PROGRAMMING flag will be set only when programming of the flash memory is in progress. If the PROGRAMMING flag is not set, that is, programming of the flash memory is not in progress, then the indicator is enabled in step 455 and the reset interrupt handler module remains in an infinite loop with the indicator illuminated until the control circuit pack is unplugged or removed from the shelf. Alternatively, if some indication is provided that the system is booting up, then in step 455 the reset interrupt handler can activate a power reset sequence. Otherwise, if the PROGRAMMING flag is set, that is, programming of the flash memory is in progress, then the RESET REQUEST flag is set in step 440. In steps 445 and 450, the hardware or software timer is set or armed to countdown the predefined time interval, and the system returns from the interrupt and resumes programming of the flash memory from the position of interruption.

Figure 4C:
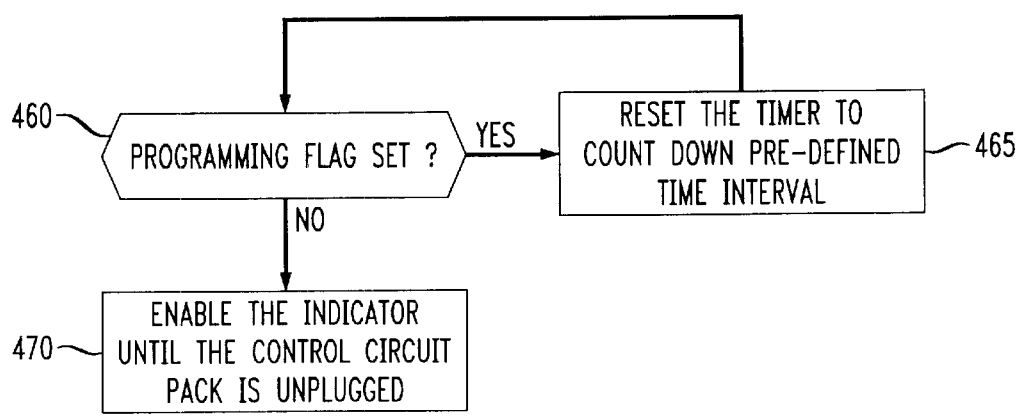

When the timer is set or armed in step 445, it automatically starts counting down the predefined time interval. Upon completion of the countdown, a timer interrupt is generated that invokes a timer interrupt handler module in FIG. 4c. In the timer interrupt handler module, a determination is made in step 460 whether the PROGRAMMING flag is set, that is, if the flash memory is still being programmed. If the PROGRAMMING flag is set, then in step 465 the timer is reset or armed to program countdown for the predefined time interval. After completion of each countdown the system returns to step 460 to check to determine whether the PROGRAMMING flag is set. Otherwise, if the PROGRAMMING flag is reset, that is, the flash memory is not currently be programmed, then the indicator is enabled in step 470 and remains activated until the control circuit pack is unplugged from the shelf. Alternatively, if the system provides some indication when the system is booting up, then in step 470 the power reset sequence is activated.

This system is advantageous in that it prevents programming of more than one block of the flash memory at a time. Specifically, this is realized using the RESET REQUEST flag. If the RESET REQUEST flag is set, that is, the reset button is enabled thereby invoking a reset interrupt handler during programming of the flash memory, then the timer interrupt handler will continuously loop back to the beginning at step 460 until the PROGRAMMING flag is reset, at which point the control circuit pack can be safely replaced. It is advantageous to use two flags in order to account for the following situation. Assuming that the programming module has completed programming of one block of the flash memory, but before the PROGRAMMING flag is reset, a reset interrupt is invoked. The reset interrupt handler detects that the PROGRAMMING flag is still set, but when the system returns from the interrupt, the programming module resets the PROGRAMMING flag. If the programming module is reinvoked before the timer times out, then the RESET REQUEST flag prevents the next block or set of blocks from being programmed.

The foregoing merely illustrates the principles of the invention. It will thus be appreciated that those skilled in the art will be able to devise various arrangements which, although not explicitly described or shown herein, embody the principles of the invention and are thus within its spirit and scope.

what is claimed is:

1. An embedded system including a control circuit pack and an uninterruptable flash memory plugged into a shelf, comprising:

a reset button for initiating processing to determine whether said control circuit pack can be safely removed from said shelf;

an indicator for signaling when said control circuit pack can be safely unplugged from said shelf;

a flash programming module for inhibiting all interrupts, except for a power reset interrupt, during programming of said flash memory; and a reset interrupt handler module invoked in response to a reset interrupt generated by said reset button during programming of said flash memory, said reset interrupt handler module enabling said indicator so as to signal that said control circuit pack can be safely unplugged from said shelf.

2. An embedded system in accordance with claim 1, wherein said reset interrupt handler module enables said indicator until said control circuit pack is unplugged from said shelf.

3. An embedded system including a control circuit pack and an interruptable flash memory plugged into a shelf, comprising:

a timer for counting down a predefined time interval;

an indicator for signaling when said control circuit pack can be safely unplugged from said shelf;

a flash programming module for inhibiting predetermined interrupts, excluding a timer interrupt and a reset interrupt, and setting a PROGRAMMING flag while programming the one block of said flash memory, when a RESET REQUEST flag is reset;

a reset button for generating a reset interrupt and temporarily cease programming of the one block of said flash memory;

a reset interrupt handler module initiated in response to invoking the reset interrupt, said reset interrupt handler enabling the indicator when the PROGRAMMING flag is reset so as to signal that said control circuit pack can be safely unplugged, and for inhibiting interrupts that require processor time in excess of a predefined time interval required to program the one block of said flash memory as counted down by said timer when the PROGRAMMING flag is set; and a timer interrupt module automatically invoked upon said timer counting down the predefined time interval, said timer interrupt module continuously resetting said timer to countdown the predefined time interval during programming of the block of said flash memory while said PROGRAMMING flag is set at the completion of the countdown of a predefined time interval, said timer interrupt module enabling said indicator when the PROGRAMMING FLAG is reset at the completion of the countdown of a predefined time interval so as to signal that said control circuit pack can be safely unplugged from said shelf.

4. An embedded system in accordance with claim 3, wherein said reset interrupt handler module comprises:

means for determining whether the PROGRAMMING flag is set;

means for enabling an indicator, when said determining means detects that the PROGRAMMING flag is reset, so as to signal that said control circuit pack can be safely unplugged from said shelf;

means for setting a RESET REQUEST flag, when said determining means detects that the PROGRAMMING flag is set; and means for setting a timer to countdown for a predefined time interval and returning from interrupt to resume programming of the one block of said flash memory from a position of interruption.

5. An embedded system in accordance with claim 4, wherein said timer interrupt handler comprises:

means for determining whether a PROGRAMMING flag is set;

means for continuously resetting said timer to countdown the predefined time interval during programming of the block of said flash memory while said PROGRAMMING flag is set at the completion of the countdown of a predefined time interval; and means for enabling said indicator when the PROGRAMMING FLAG is reset at the completion of the countdown of a predefined time interval so as to signal that said control circuit pack can be safely unplugged from said shelf.

6. An embedded system in accordance with claim 5, wherein said enabling means in said reset interrupt handler module and said timer interrupt module enable said indicator until said control circuit pack is unplugged from said shelf.

7. A method for preventing removal of a control circuit pack from a shelf of an embedded system during programming of at least one block of an uninterruptable flash memory while all of the interrupts, except for a power reset interrupt, are inhibited, said embedded system including a reset button enabled prior to unplugging said control circuit pack from said shelf, comprising:

when all of the interrupts except for a power reset interrupt are enabled, in response to enabling the reset button;

invoking a reset interrupt; and enabling an indicator signaling that said control circuit pack can be safely unplugged from said shelf.

8. A method for preventing removal of a control circuit pack from a shelf of an embedded system during programming of one block of an interruptable flash memory while predetermined interrupts, excluding a reset interrupt and a timer interrupt, are inhibited, said embedded system including a reset button enabled prior to unplugging said control circuit pack from said shelf for invoking a reset interrupt, and a timer for counting down a predefined time interval, comprising:

when a RESET REQUEST flag is reset, in response to invoking a programming module;

inhibiting predetermined interrupts, except for a timer interrupt and a reset interrupt;

setting a PROGRAMMING flag; and programming of one block of the flash memory.

9. A method in accordance with claim 8, in response to invoking the reset interrupt, further comprising:

temporarily cease programming of said flash memory at a position of interruption;

when said PROGRAMMING flag is not set, enabling the indicator signaling that the control circuit pack can be safely unplugged and terminating processing; and when said PROGRAMMING flag is set: (a) setting a RESET REQUEST flag; (b) setting the timer to countdown for the predefined time interval; and (c) returning from the reset interrupt to said programming module at the position of interruption.

10. A method in accordance with claim 9, in response to said timer completing the countdown for the predefined timer interval, further comprising:

until programming of the block in said flash memory is no longer in progress, continuously resetting a timer to countdown for a predefined time interval; and when programming of the block in said flash memory is no longer in progress at the completion of the timer countdown for the predefined time interval, enabling the indicator signaling that the control circuit pack can be safely unplugged and terminating processing.

11. A method in accordance with claim 9, wherein programming of the one block of said flash memory is inhibited, while said RESET REQUEST flag is set.

* * * * *